US010671300B1

(12) United States Patent
DeSimone et al.

(10) Patent No.: US 10,671,300 B1
(45) Date of Patent: *Jun. 2, 2020

(54) COMMAND SEQUENCE RESPONSE IN A MEMORY DATA BUFFER

(71) Applicant: Integrated Device Technology, Inc., San Jose, CA (US)

(72) Inventors: Craig DeSimone, Dacula, GA (US); Praveen Singh, Alphareatta, GA (US); Alejandro Gonzalez, Johns Creek, GA (US); Yue Yu, Johns Creek, GA (US); YanBo Wang, Duluth, GA (US)

(73) Assignee: Intergrated Device Technology, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/258,972

(22) Filed: Jan. 28, 2019

Related U.S. Application Data

(63) Continuation of application No. 15/367,742, filed on Dec. 2, 2016, now Pat. No. 10,198,200.

(60) Provisional application No. 62/372,396, filed on Aug. 9, 2016, provisional application No. 62/372,906, filed on Aug. 10, 2016, provisional application No. 62/263,567, filed on Dec. 4, 2015, provisional application No. 62/263,581, filed on Dec. 4, 2015.

(51) Int. Cl.
*G06F 3/06* (2006.01)
*G11C 11/4096* (2006.01)
*G11C 11/4093* (2006.01)

(52) U.S. Cl.
CPC .......... *G06F 3/0619* (2013.01); *G06F 3/0653* (2013.01); *G06F 3/0656* (2013.01); *G06F 3/0659* (2013.01); *G06F 3/0673* (2013.01); *G11C 11/4093* (2013.01); *G11C 11/4096* (2013.01)

(58) Field of Classification Search
CPC .... G06F 3/0619; G06F 3/0653; G06F 3/0656; G06F 3/0659; G06F 3/0673; G11C 11/4093; G11C 11/4096
See application file for complete search history.

(56) References Cited

U.S. PATENT DOCUMENTS

| | | |
|---|---|---|
| 9,653,147 B1 | 5/2017 | Wang |
| 2006/0248261 A1 | 11/2006 | Jacob ................................ 711/1 |
| 2008/0031079 A1 | 2/2008 | Osawa ........................ 365/233.1 |
| 2009/0175328 A1* | 7/2009 | Kim .......................... G11C 7/02 375/233 |
| 2010/0162037 A1 | 6/2010 | Maule ........................... 711/154 |
| 2015/0310898 A1 | 10/2015 | Takefman ..................... 711/105 |

* cited by examiner

*Primary Examiner* — Aracelis Ruiz

(74) *Attorney, Agent, or Firm* — Christopher P. Maiorana, PC

(57) ABSTRACT

A method for responding to a command sequence includes receiving a signal from a host carrying a plurality of commands in the command sequence, detecting a non-consecutive clock associated with a start of a current command in the command sequence, and generating a control signal in an active state to indicate detection of the non-consecutive clock.

20 Claims, 12 Drawing Sheets

COMMAND SEQUENCE RESPONSE IN A MEMORY DATA BUFFER

This application relates to U.S. Ser. No. 15/367,742, filed Dec. 2, 2016, now U.S. Pat. No. 10,198,200, which relates to U.S. Provisional Application No. 62/263,567, filed Dec. 4, 2015, U.S. Provisional Application No. 62/263,581, filed Dec. 4, 2015, U.S. Provisional Application No. 62/372,396, filed Aug. 9, 2016, and U.S. Provisional Application No. 62/372,906, filed Aug. 10, 2016, each of which are hereby incorporated by reference in their entirety.

FIELD OF THE INVENTION

The present invention relates to digital receivers generally and, more particularly, to a method and/or apparatus for command sequence response in a memory data buffer.

BACKGROUND

Conventional data buffers in memory systems contain decision feedback equalizers (DFE) that correct for inter-symbol interference in streams of data bits. Sometimes a stream of the data bits is targeted for a single memory device in the memory system. Other times, different parts of the stream are targeted for different memory devices. When a stream targets multiple memory devices, buffers in the DFE circuitry can retain unwanted old parts of the stream when the stream changes to a new target. The old parts cause margin degradation for the received data. The incorrect buffering is commonly due to sequential but non-consecutive commands associated with the different targets.

It would be desirable to implement a method and/or apparatus for command sequence response in a memory data buffer.

SUMMARY

The present invention concerns a method for responding to a command sequence that includes receiving a signal from a host carrying a plurality of commands in the command sequence, detecting a non-consecutive clock associated with a start of a current command in the command sequence, and generating a control signal in an active state to indicate detection of the non-consecutive clock.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method and/or apparatus for command sequence response in a memory data buffer that may (i) generate a control signal from a sequence of command signals, (ii) synchronize the control signal to a local clock, (iii) detect non-consecutive accesses in the command signals, (iv) evaluate each access command in the sequence, (v) avoid margin degradation at a receiver end, (vi) utilize the command sequence to initialize one or more data buffer features in a DDR4 pseudo open drain bus application and/or (vii) be implemented in one or more integrated circuits.

Figure 1:
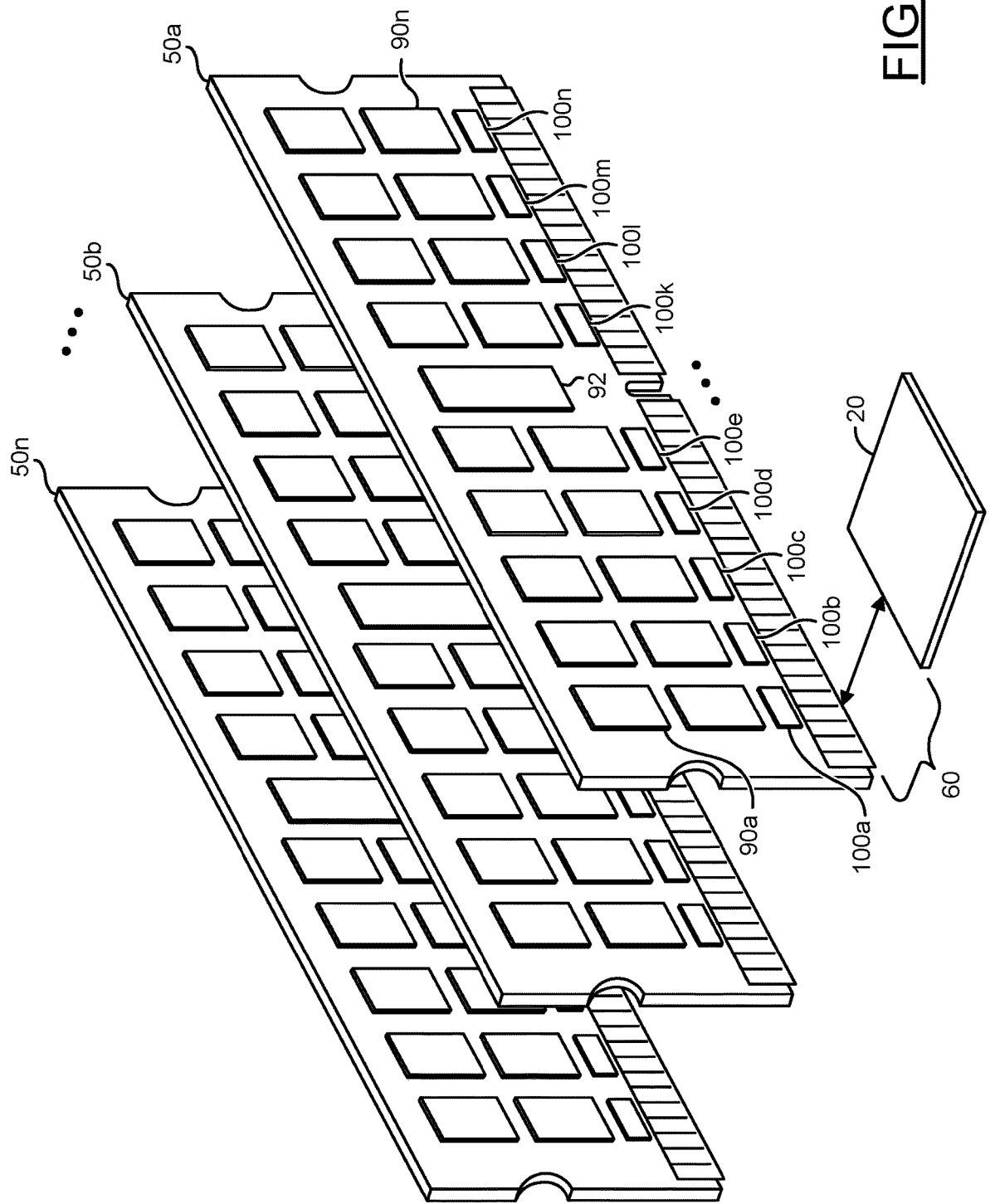
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In various embodiments, the circuits 50a-50n may comprise a number of blocks (or circuits) 90a-90n, a block (or circuit) 92, a number of blocks (or circuits) 100a-100n, and/or various other blocks, circuits, pins, connectors and/or traces. The circuits 90a-90n may implement memory devices. In an example, the circuits 90a-90n may be implemented as synchronous dynamic random-access memory (SDRAM) devices (or chips, or modules). The circuit 92 may be implemented as a registered clock driver (RCD). In an example, the RCD circuit 92 may be implemented as a DDR4 RCD circuit. The circuits 100a-100n may be configured as data buffers. The type, arrangement and/or number of components of the memory modules 50a-50n may be varied to meet the design criteria of a particular implementation.

The memory modules 50a-50n are shown connected to a block (or circuit) 20. The circuit 20 may implement a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 SDRAM memory modules. In an example, the circuits 50a-50n may have a memory module density of 512 gigabyte (GB), one terabyte (TB), or higher per module (e.g., compared to 128 GB per dual in-line memory module (DIMM) in DDR3). In embodiments implementing DDR4 SDRAM memory modules, the circuits 50a-50n may operate at voltages of 1.2-1.35 volts (V) with a frequency between 800-2133 megahertz (MHz) (e.g., compared to 1.5-1.65V at frequencies between 400-1067 MHz in DDR3). In some embodiments, the circuits 50a-50n may be implemented as low voltage DDR4 memory modules and operate at 1.05V. For example, in embodiments implementing low voltage DDR4 SDRAM memory modules, the circuits 50a-50n may implement 35% power savings compared to DDR3 memory. In embodiments implementing DDR4 SDRAM memory modules, the circuits 50a-50n may transfer data at speeds of 2.13-4.26 giga-transfers per second (GT/s) and higher (e.g., compared to 0.8-2.13GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM). The data buffers 100a-100n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
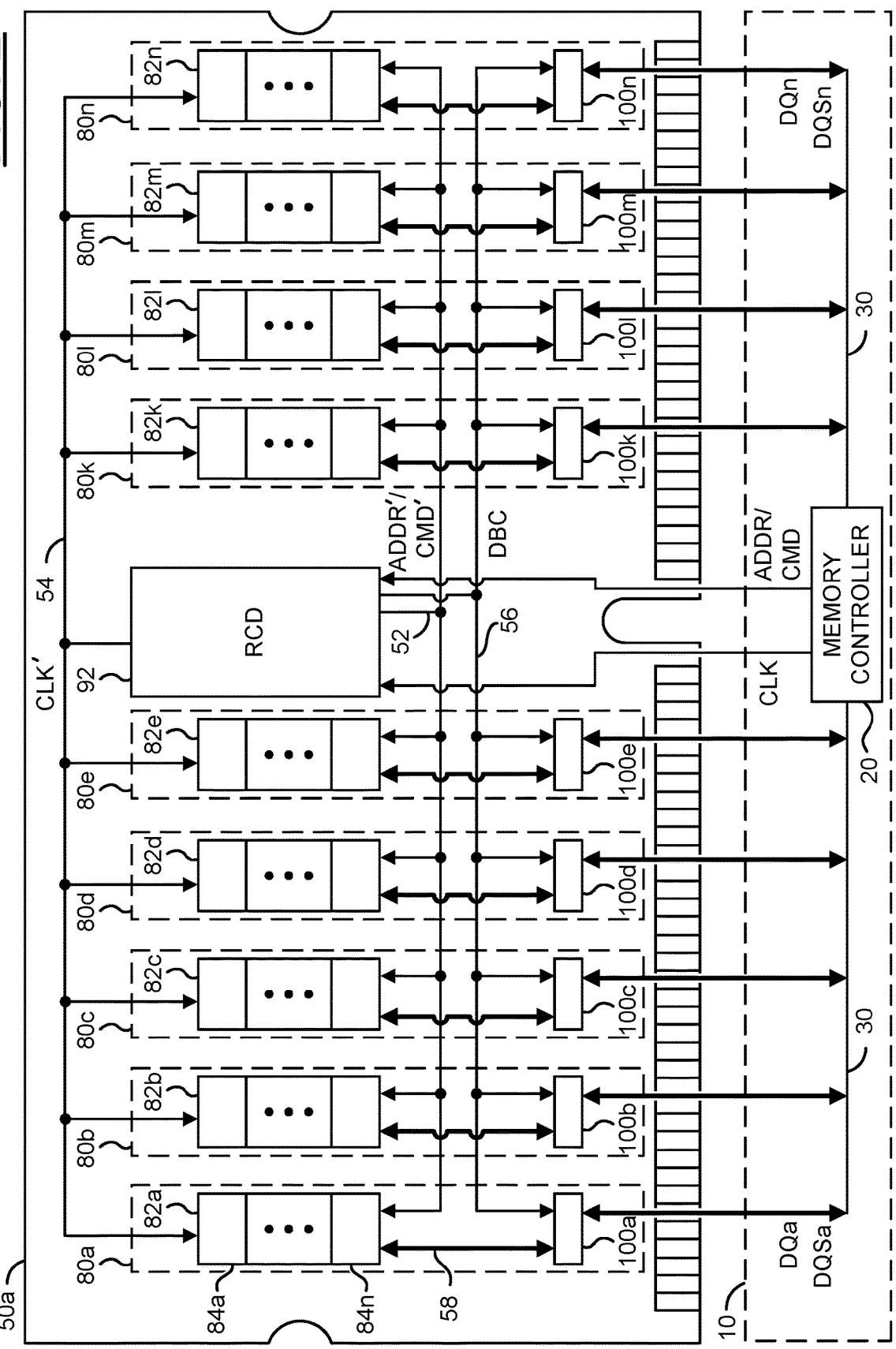
FIG. 2 is a block diagram illustrating a memory module of the memory system.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine that communicates with the memory module 50a.

The memory module 50a may comprise one or more blocks (or circuits) 80a-80n and/or the RCD circuit 92. The circuits 80a-80n may implement data paths of the memory module 50a. For example, the data path 80a may include a block 82a and/or the data buffer 100a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 92. A data bus 30 may be connected between the memory controller and the data paths 80a-80n. The memory controller 20 may generate and/or receive data signals (e.g., DQa-DQn) and data strobe signals (e.g., DQSa-DQSn) that may be presented/received from the data bus 30. Portions of the signals DQa-DQn and DQSa-DQSn may be presented to respective data paths 80a-80n.

The RCD circuit 92 may be configured to communicate with the memory controller 20, the memory channels 82a-82n and/or the data buffers 100a-100n. The RCD circuit 92 may decode instructions received from the memory controller 20. For example, the RCD circuit 92 may receive register command words (RCWs). In another example, the RCD circuit 92 may receive buffer control words (BCWs). The RCD circuit 92 may be configured to train the DRAM chips 84a-84n, the data buffers 100a-100n and/or command and address lines between the RCD circuit 92 and the memory controller 20. For example, the RCWs may flow from the memory controller 20 to the RCD circuit 92. The RCWs may be used to configure the RCD circuit 92.

The RCD circuit 92 may be used in both LRDIMM and RDIMM configurations. The RCD circuit 92 may implement a 32-bit 1:2 command/address register. The RCD circuit 92 may support an at-speed bus (e.g., a BCOM bus between the RCD circuit 92 and the data buffers 100a-100n). The RCD circuit 92 may implement automatic impedance calibration. The RCD circuit 92 may implement command/address parity checking. The RCD circuit 92 may control register RCW readback. The RCD circuit 92 may implement a 1 MHz inter-integrated circuit ($I^2C$) bus (e.g., a serial bus). Inputs to the RCD circuit 92 may be pseudo-differential using external and/or internal voltages. The clock outputs, command/address outputs, control outputs and/or data buffer control outputs of the RCD circuit 92 may be enabled in groups and independently driven with different strengths.

The RCD circuit 92 may receive the signal CLK and/or the signals ADDR/CMD from the memory controller 20. Various digital logic components of the RCD circuit 92 may be used to generate signals based on the signal CLK and/or the signals ADDR/CMD and/or other signals (e.g., RCWs). The RCD circuit 92 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals ADDR'/CMD' and CLK' may be transmitted on a common bus 52 and a common bus 54, respectively. The RCD circuit 92 may generate one or more signals (e.g., DBC). The signals DBC may implement dada buffer control signals. The signal DBC may be presented to the data buffers 100a-100n. The signals DBC may be transmitted on a common bus 56 (e.g., a data buffer control bus).

The data buffers 100a-100n may be configured to receive commands and data from the bus 56. The data buffers 100a-100n may be configured to generate/receive data to/from the bus 30. The bus 30 may comprise traces, pins and/or connections between the memory controller 20 and the data buffers 100a-100n. A bus 58 may carry the data between each of the data buffers 100a-100n and respective memory channels 82a-82n. The data buffers 100a-100n may be configured to buffer data on the buses 30 and 58 for write operations (e.g., data transfers from the memory controller 20 to the corresponding memory channels 82a-82n). The data buffers 100a-100n may be configured to buffer data on the buses 30 and 58 for read operations (e.g., data transfers from the corresponding memory channels 82a-82n to the memory controller 20).

The data buffers 100a-100n may exchange data with the DRAM chips 84a-84n in small units (e.g., 4-bit nibbles). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 100a-100n through an upper nibble and a lower nibble. For two set/four DRAM chip (e.g., 84a-84d) implementations, each set may contain two DRAM chips (e.g., 84a-84b or 84c-84d). A first set may be connected to the respective data buffers 100a-100n through the upper nibble. The other set may be connected to the respective data buffers 100a-100n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 100a-100n through the upper nibble. The other set of four DRAM chips (e.g., 84e-84h) may connect to the respective data buffers 100a-100n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 100a-100n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 100a-100n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 100a-100n. The memory modules 50a-50n may implement 2 millimeter (mm) frontside bus traces and backside traces (e.g., the connectors/pins/traces 60). A propagation delay through the data buffers 100a-100n may be 33% faster than through a DDR3 memory buffer (e.g., resulting in reduced latency). In some embodiments, the data buffers 100a-100n may be smaller (e.g., a reduced area parameter) than a data buffer used for DDR3 applications.

Figure 3:
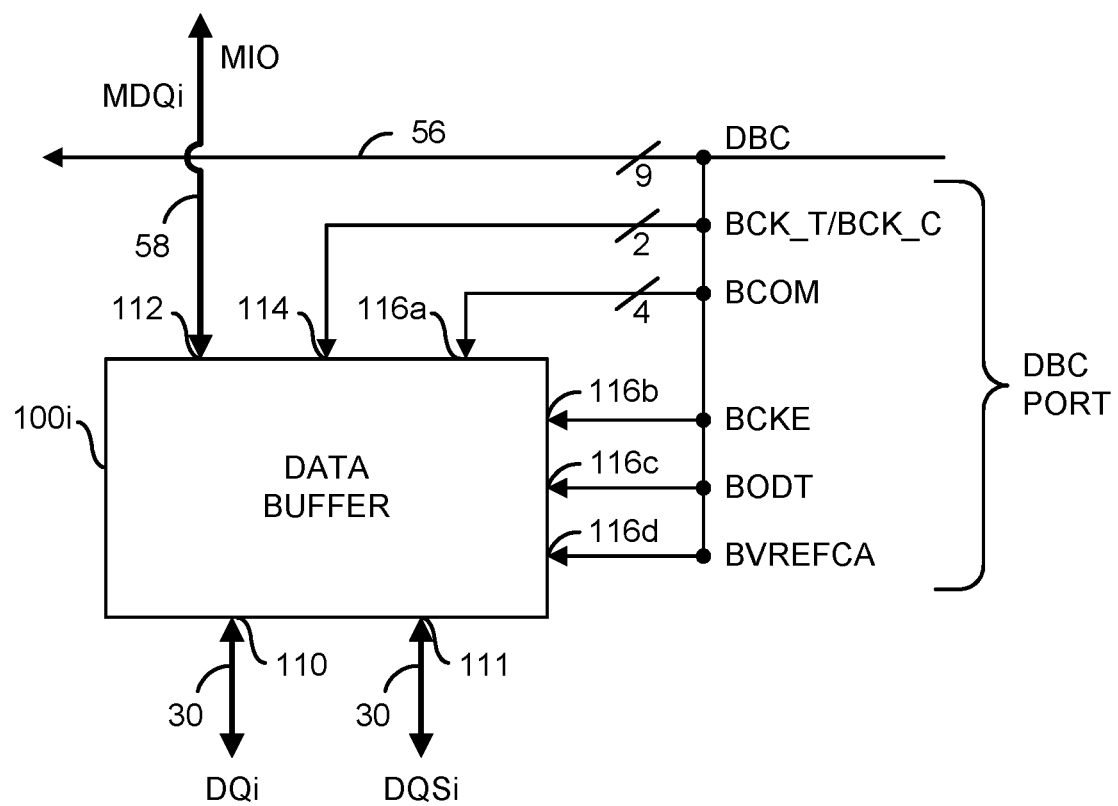
FIG. 3 is a block diagram illustrating an example data buffer of the memory system.

Referring to FIG. 3, a diagram is shown illustrating a data buffer 100i in accordance with an example embodiment of the invention. The data buffer 100i may be representative of an example embodiment of the data buffers 100a-100n. The data buffer 100i is shown having a first input/output 110, a second input/output 111, a third input/output 112, a fourth input/output 114, multiple fifth inputs 116a-116d.

The first input/output 110 is configured for presenting/receiving the signals DQi between the data buffer 100i and the controller 20. The second input/output 111 is configured for presenting/receiving the signals DQSi (e.g., the data strobe signals DQS) between the data buffer 100i and the controller 20. The third input/output 112 is configured for presenting/receiving the signals DQi as memory input/output (MIO) signals (e.g., MDQi) corresponding to a memory channel between the data buffer 100i and the respective memory devices (e.g., DRAM chips) 90a-90n.

The signals MIO are generally transmitted between the memory modules 90a-90n and the respective data buffer 100a-100n. In an example, data (e.g., the signals DQi) from the memory controller 20 may be presented to the data buffer 100i, buffered in the data buffer 100i, then transmitted to the respective memory device(s) 90a-90n. In another example, data from the respective memory device(s) 90a-90n may be presented to the data buffer 100i, buffered in the data buffer 100i, and then transmitted on an appropriate memory channel to the memory controller 20.

The data buffer 100i is shown also receiving signals (e.g., DBC) from the bus 56 at a control port (e.g., DBC PORT). The signals DBC may be presented to the data buffers 100a-100n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 100i is shown having the fourth input 114 receiving the signals BCK_T/BCK_C, the fifth input 116a receiving the signal BCOM, the input 116b receiving the signal BCKE, the input 116c receiving the signal BODT, and the input 116d receiving the signal BVREFCA.

In various embodiments, the signals BCKT/BCKC may be implemented as a 2-bit signal representing a differential (e.g., true (T) and complementary (C) versions) clock signal for the duplex data buffers 100a-100n. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 92 to the data buffers 100a-100n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 100a-100n may receive a set of data buffer commands (e.g., for writing buffer control words (BCWs)) from the signals DBC. The buffer control words may be used to customize operation of the data buffers 100a-100n. The buffer control words may flow from the memory controller 20, through the RCD circuit 92, to the data buffers 100a-100n. The buffer control words may be similar to register control words (RCWS) used for configuring the RCD circuit 92. Similar to commands for writing the register control words, the commands for writing the buffer control words may look like an MRS7 command, where the address lines are really the payload.

In embodiments where the bus 56 comprises nine pins, the RCD circuit 92 may do more than pass a buffer control word directly through to the data buffers 100a-100n. In one example, the RCD circuit 92 may convert (e.g., multiplex) an MRS7 command format into a buffer control word in a BCOM format. The RCD circuit 92 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 100a-100n, the data buffers 100a-100n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM, the RCD circuit 92 may send all read/write commands and MRS information over the bus 56 (e.g., to allow the data buffers 100a-100n to keep track of what the memory devices 90 are doing). In some embodiments, different buffer commands may take a different number of cycles to transfer the information.

The RCD circuit 92 may receive an MRS7 command from the memory controller 20 (e.g., from a host). For example, a host may want to change a parameter (e.g., typically on initialization or boot up of a computing device). The RCD circuit 92 may check the MRS7 command to determine whether the address bit 12 is set to 1 (e.g., a logical one). In an example, when an address bit 12 of the MRS7 command is set to 1, the RCD circuit 92 may recognize the command as a buffer command (e.g., a command that is not meant for the RCD circuit 92). The RCD circuit 92 may convert the command from the memory controller 20 to a buffer control word and send the buffer control word to the data buffers 100a-100n via the bus 56. The data buffers 100a-100n may write the buffer control word to a function space to complete the command.

The data buffers 100a-100n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 100a-100n may be decided based on system level configurations. Generally, most of the configuration of the data buffers 100a-100n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 100a-100n. The bus 56 may also send commands (e.g., data reads and/or data writes) that control data traffic through the data buffers 100a-100n. For example, some commands may optimize power consumption and noise filtering (e.g., equalization) of the data buffers 100a-100n. In another example, read/write delays may be added per data line.

The data buffers 100a-100n may implement dual multi-bit (e.g., 4-bit) bidirectional data registers with differential data strobes (e.g., DQS_T/DQS_C). The data buffers 100a-100n may implement automatic impedance calibration. The data buffers 100a-100n may implement BCOM parity checking. The data buffers 100a-100n may implement control register (e.g., buffer control word) readback.

Figure 4:
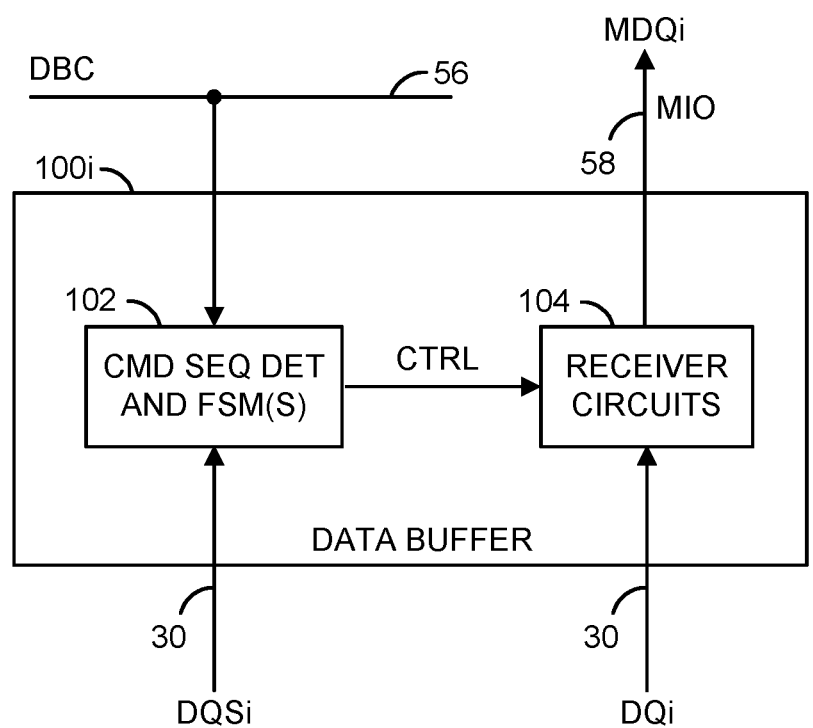
FIG. 4 is a diagram of the data buffer.

Referring to FIG. 4, a diagram is shown illustrating an example implementation of the data buffer 100i. The data buffer generally comprises a block (or circuit) 102 and one or more blocks (or circuits) 104. The DBC bus 56 may be received at an interface to the circuit 102. The DBC bus 56 may carry a series of commands for the data buffer 100i to execute. The signal DQSi may be received by the circuit 102 via an interface to the bus 30. The signal DQi may be received by the circuits 104 via an interface to the bus 30. The circuits 104 may transfer the data from the signals DQi via the bus 58 as the signals MIO (e.g., MDQi). A signal (e.g., CTRL) may be generated by the circuit 102 and received by the circuits 104. The signal CTRL may provide control information to the circuits 104 to handle non-continuous command sequences and/or non-continuous forwarded clock signals (e.g., the signal DQS).

The circuit 102 may implement a command sequence detector circuit 102. The command sequence detector circuit 102 generally detects sequences of commands that may be non-continuous (or discontinuous). In various embodiments, the command sequence detector circuit 102 may be operational to detect a non-consecutive clock associated with a start of a command sequence. The command sequence detector circuit 102 may generate the signal CTRL in an active state to indicate detection of the non-consecutive clock associated with the start of the command sequence. The signal CTRL in the active state may be used by the command sequence detector circuit 102 to initialize the circuits 104 in preparation to receive an initial data bit corresponding to a targeted access.

The circuits 104 may implement one or more receiver circuits. Each receiver circuit 104 may be operational to receive data in one or more of the signals DQa-DQn (e.g., DQi in the illustrated example) via the bus 30. Reception of the data may be based on the signal CTRL. In some embodiments, the receiver circuits 104 may include decision feedback equalizers (DFE) implemented with storage elements of length n equal to the number of taps of the DFE. The signal CTRL is generally independently generated to cover unique cases where data may be non-continuous but the pin clock signal DQS is continuous. The DFE may use the signal CTRL as a tap load control signal that prevents tap contribution until known good data has been registered. Once received and equalized, the data may be presented on the bus 58 in the signals MIO. An example application of the FSM circuit 120 to a receiver circuit may be found in co-pending U.S. application Ser. No. 15/367,586, filed Dec. 2, 2016, which is hereby incorporated by reference in its entirety.

Figure 5:
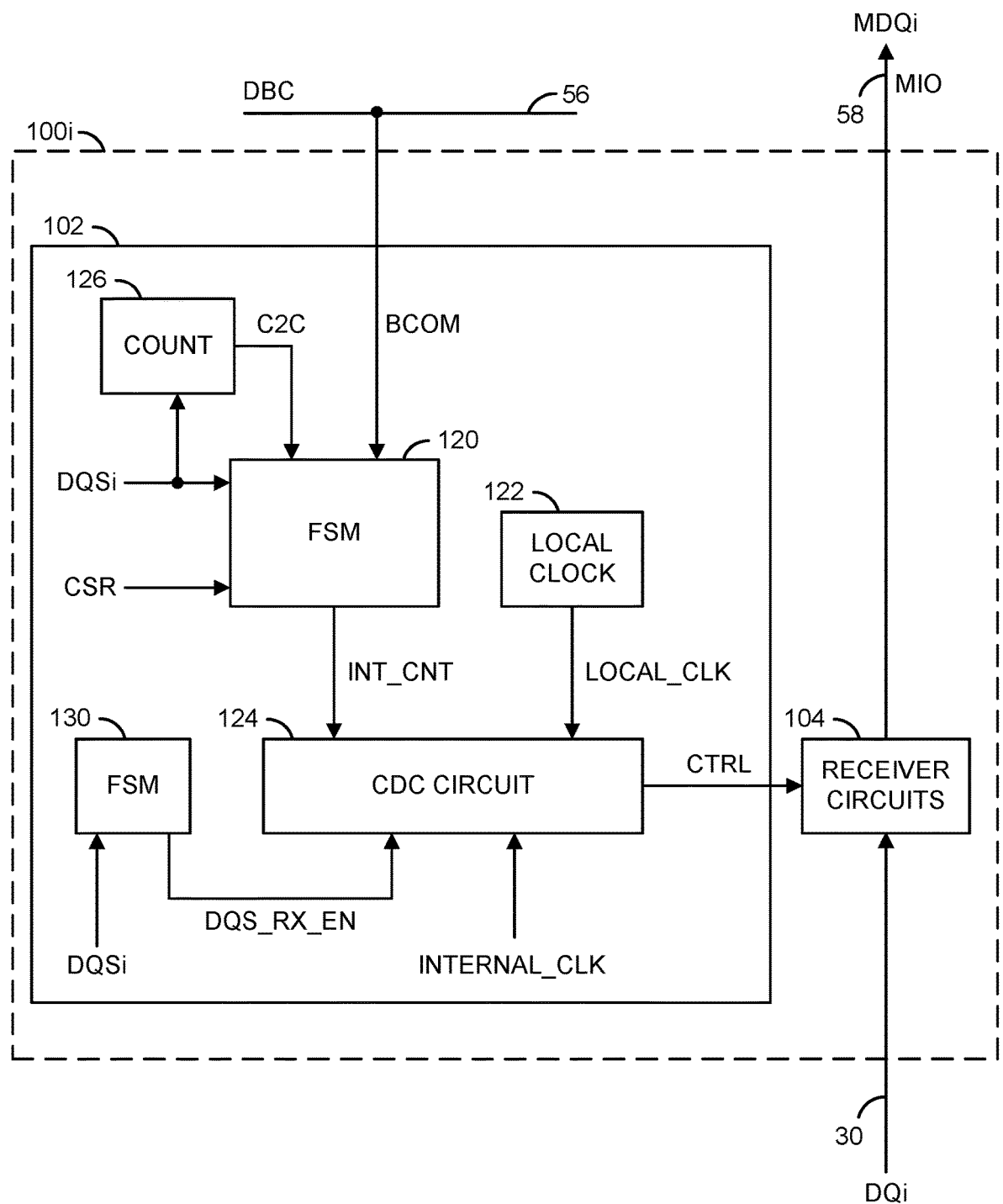
FIG. 5 is a diagram of a command sequence detector in the data buffer.

Referring to FIG. 5, a diagram is shown illustrating an example implementation of the command sequence detector circuit 102 within the data buffer 100i is shown in accordance with an embodiment of the invention. The command sequence detector circuit 102 generally detects sequences of commands that may be non-continuous. The command sequence detector circuit 102 generally comprises a block (or circuit) 120, a block (or circuit) 122, a block (or circuit) 124, a block (or circuit) 126 and a block (or circuit) 130. The command sequence detector circuit 102 may be in communication with one or more receiver circuits 104 of the data buffer 100i.

The DBC bus 56 may be received by the circuit 120. The DBC bus 56 may carry a series of commands for the data buffer 100i to execute. The signal DQSi may also be received by the circuit 120, the circuit 126 and the circuit 130. The signal DQSi may provide strobe information for data being transferred to the data buffer 100i via the signal DQi. The circuit 120 may receive mode register set (MRS) data via the signal BCOM. A signal (e.g., CSR) may be received by the circuit 120. The signal CSR may carry control status register data. A signal (e.g., C2C) may be generated by the circuit 126 and received by the circuit 120. The signal C2C generally carries a count of the number of cycles of the signal DQSi since the most recent command was received by the data buffer 100i (e.g., a command-to-command count).

A signal (e.g., INT_CNT) may be generated by the circuit 120 and received by the circuit 124. The signal INT_CNT may carry control information relative to the sequence of commands received via the bus 56. The circuit 130 may generate a signal (e.g., DQS_RX_EN). The signal DQS_RX_EN may carry data strobe receiver enable information. A signal (e.g., INTERNAL_CLK) may be received by the circuit 124. The signal INTERNAL_CLK may provide a clock signal generated internally in the data buffer 100i. The circuit 122 may generate a signal (e.g., LOCAL_CLK) received by the circuit 124. The signal LOCAL_CLK may be a clock signal generated locally for internal use by the command sequence detector circuit 102. The signal CTRL may be generated by the circuit 124 and received by the receiver circuits 104. The signal CTRL may provide control information to the receiver circuits 104 to handle non-continuous command sequences and/or non-continuous forwarded clock signals.

The circuit 120 may implement a finite state machine (FSM) circuit. The FSM circuit 120 is generally operational to monitor the data buffer control bus 56 (e.g., the data buffer command signal BCOM) for a non-consecutive command sequence to the same device that describes an expected command sequence length. Detection of the non-consecutive command sequence may be indicated in the signal INT_CNT. The detection is generally based on data in the signals CSR and BCOM. The signal CSR may convey a Gap1_smooth_enable bit and a No_gap1_for_changing_Data0_rank bit. The MRS information in the signal BCOM generally provides write preamble length data, write CRC data, and burst length data. The signal BCOM may convey a last write burst length, a last write length, and a current write length.

The FSM circuit 120 may be operational to receive a command sequence in the signal BCOM associated with a targeted access to a corresponding memory channel 80a-80n. The FSM circuit 120 generally detects a non-consecutive clock (e.g., the strobe signal DQSi) associated with a start of the command sequence observed on the DBC bus 56. Upon detection of the non-consecutive clock, the FSM circuit 120 may generate the signal INT_CNT indicating that the detection is associated with the start of the command sequence.

The circuit 122 may implement a local clock circuit. The local clock circuit 122 may generate an independent clock signal LOCAL_CLK. The command sequence detector circuit 102 may use the local clock signal LOCAL_CLK to ensure timing margins through clock domain crossing circuitry and/or multiple cycle path circuitry when clocked by the clock signal INTERNAL_CLK of the corresponding memory module 50a-50n.

The circuit 124 may implement a clock domain crossing (CDC) circuit. The CDC circuit 124 is generally operational to traverse the signal INT_CNT and the signal DQS_RX_EN from the local clock domain (e.g., associated with the signal LOCAL_CLK) to the internal clock domain (e.g., associated with the signal INTERNAL_CLK) and present the output control signal CTRL to the circuit 126. In various embodiments, the CDC circuit 124 may also be operational to logically NOR the signal INT_CNT and the signal DQS_RX_EN to create the signal CTRL.

The circuit 126 may implement a counter circuit. The counter circuit 126 is generally operational to count a number of clock cycles in the signal DQS from the last write command until a current write command. The count value may be presented to the FSM circuit 120 in the signal C2C. The count may be saturated at a predetermined maximum value. The count may also be initialized to the predetermined maximum value under appropriate conditions (e.g., BCKE power down, reset, etc.). In some embodiments, copies and/or variations of the FSM circuit 120 and/or the counter circuit 120 126 may be implemented in the RCD circuit 102 for counting and responding to RCD-related commands.

The circuit 130 may implement another finite state machine circuit. The FSM circuit 130 may be operational to generate the signal DQS_RX_EN (DQS receiver enable) based on the signal DQSi. The FSM circuit 130 may use a sequence of memory reads and write to find a center of a programmable read DQS preamble in the signal DQSi. DQS receiver enable information in the signal DQS_RX_EN generally helps ensure that information in the signal DQS is properly received. Additional details regarding read preamble training may be found in the DDR4 SDRAM specification JESD79-4A, section 4.20.3.

The command sequence detector circuit 102 may be compliant with the commands and timing described in the DDR4 SDRAM specification JESD79-4A. The command sequences and timing conditions may be varied according to the design criteria of a particular implementation. For example, the command sequence detector circuit 102 may be configured to operate with different types of commands and/or at faster timing speeds than in the DDR3 SRAM specification.

Figure 6:
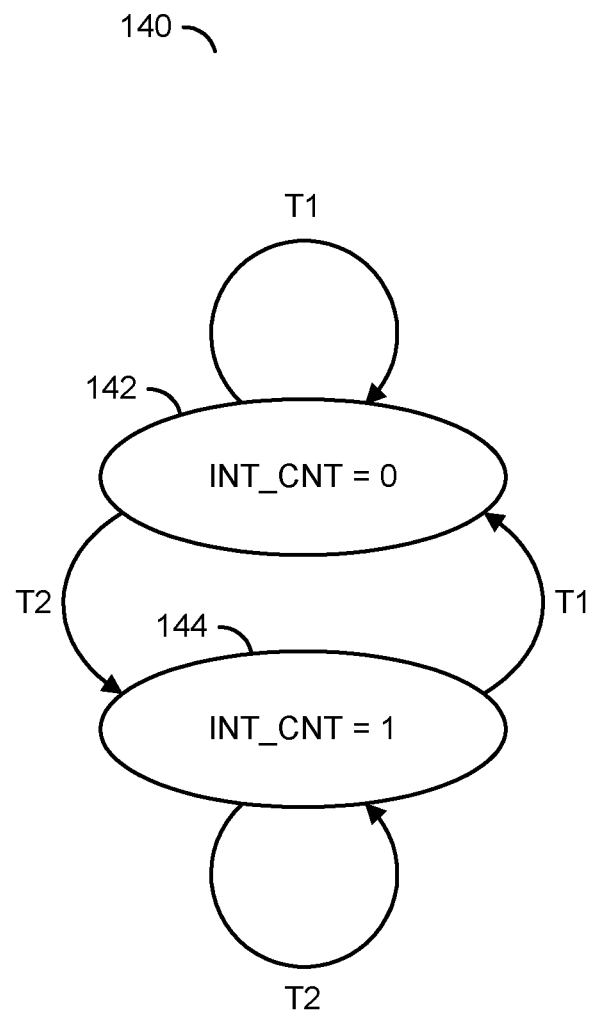
FIG. 6 is a state transition diagram of a finite state machine in the data buffer.

Referring to FIG. 6, a state transition diagram 140 illustrating an example implementation of the FSM circuit 120 of FIG. 5 is shown. Multiple conditions (e.g., Cond A to Cond P) may be determined by the FSM circuit 120 according to Table I as follows:

TABLE I

| | OTP-Mapped MRS | | Inputs from MRS | | | Inputs from BCOM | | | Out INT_ | |
|---|---|---|---|---|---|---|---|---|---|---|
| Cond | CSRa | CSRb | PRE | CRC | BL | LAST | RANK | C2C | CNT | Com |
| A | 0 | X | X | X | X | X | X | X | 0 | 1 |
| B | 1 | 0 | X | X | BL8/BC4 (OTF) | BC4 | X | X | 0 | 2 |
| C | 1 | 0 | X | X | BC4 (FIXED) | BC4 | X | X | 0 | 2 |
| D | 1 | 0 | 2T | X | X | X | X | X | 0 | 3 |
| E | 1 | 0 | 1T | DISABLE | BL8 (FIXED) | X | X | <6 | 1 | 4 |
| F | 1 | 0 | 1T | ENABLED | BL8 (FIXED) | X | X | <7 | 1 | 4 |
| G | 1 | 0 | 1T | DISABLE | BL8/3C4 (OTF) | BL8 | X | <6 | 1 | 4 |
| H | 1 | 0 | 1T | ENABLE | BL8/BC4 (OTF) | BL8 | X | <7 | 1 | 4 |

TABLE I-continued

| | OTP-Mapped MRS | | Inputs from MRS | | | Inputs from BCOM | | | Out INT_ | |
|---|---|---|---|---|---|---|---|---|---|---|
| Cond | CSRa | CSRb | PRE | CRC | BL | LAST | RANK | C2C | CNT | Com |
| I | 1 | 1 | X | X | BL8/BC4 (OTF) | BC4 | X | X | 0 | 2 |
| J | 1 | 1 | X | X | BC4 (FIXED) | BC4 | X | X | 0 | 2 |
| K | 1 | 1 | 2T | X | X | X | X | X | 0 | 3 |
| L | 1 | 1 | 1T | DISABLE | BL8 (FIXED) | X | S/D | <6 | 1/0 | 5 |
| M | 1 | 1 | 1T | ENABLED | BL8 (FIXED) | X | S/D | <7 | 1/0 | 5 |
| N | 1 | 1 | 1T | DISABLE | BL8/BC4 (OTF) | BL8 | S/D | <6 | 1/0 | 6 |
| P | 1 | 1 | 1T | ENABLE | BL8/BC4 (OTF) | BL8 | S/D | <7 | 1/0 | 6 |

The columns in Table I are generally explained as follows. The leftmost column may specify multiple conditions (e.g., Cond A to Cond P) of various input signals received by the FSM circuit 120. The next eight columns generally identify the individual data items received by the FSM circuit 120. The second rightmost column may represent the state (e.g., asserted or deasserted) of the signal INT_CLK. The rightmost column generally provides a list of comments associated with the conditions.

On-Time Programmable (OTP)-Mapped Mode Register Set (MRS) columns (e.g., CSRA and CSRb) may be defined as follows. The column CSRa may include the GAP1_SMOOTH_ENABLE information from the control status register. The column CSRb may include the NO_GAP1_FOR_CHANGING_DAT0_RANK information from the control status register.

Inputs from the MRS columns (e.g., PRE, CRC and BL) may be defined as follows. The column PRE may identify the MR4.A12 Write Preamble. The column CRC may identify the MR2.A12 Write cyclic redundancy check (CRC). The column BL may identify the MR0.A1:A0 Burst Length.

Inputs from signal BCOM columns (e.g., LAST, RANK, C2C and INT_CNT) may be defined as follows. The column LAST may identify a last write burst length from BCOM DAT0. The column RANK may specify a last write rank versus current rank (from BCOM WR DAT0). The last write command computed from WR DAT0 field for BC4 on the fly, and may have at least three cycles to set up for next write command. The current burst latency (from WR BCOM0) may be a "don't care" for output generation, so the output may be computed at BCOM WR and the last write burst length on subsequent command. The column C2C may identify BCOM command-to-command (e.g., write-to-write, read-to-read, power-to-power, power-to-other, other-to-power) spacing. The command-to-command spacing may be pre-computed in the counter circuit 126 by counting number of clocks from the last command. The column INT_CNT may identify a GAP1_SMOOTHED_WRITE_OUT bit (value if true=1/false=0). The signal INT_CNT may be synchronized to the receive clock domain. The setup and hold margin of the path may be multiple cycles. The signal INT_CNT may be valid between the command spacings, so the receiver circuit 104 may determine to reset decision feedback equalizer flip-flops or let the flip-flops keep free incrementing based on the signal DQS.

The rightmost column may include comments (e.g., Com 1 to Com 6) associated with the conditions A-P and defined as follows. The comment 1 generally means always deassert the signal INT_CNT if GAP1_SMOOTH_ENABLE is deasserted. The comment 2 generally means any command following a BC4 may be gapped DQS as $t_{CCD\_s}$=4. The acronym OTF may stand for on-the-fly. The comment 3 means that the 2T preamble may always be gapped. The comment 4 generally means that the signal INT-CNT is asserted according to the table regardless of BCOM rank identification in the RANK column. The comment 5 generally indicates that conditions L and M may simplify to a spacing≤BL/2+write CRC+1 (each variable in unit clocks where tPRE=1). If the last BCOM rank is the same (S) as the current BCOM rank, the signal INT_CNT is asserted. If the last BCOM rank is different (D) than the current BCOM rank, the signal INT_CNT is deasserted. The comment 6 indicates that conditions N and P may simplify to conditions L and M with BCOM DAT field at BL8. If the last BCOM rank is the same (S) as the current BCOM rank, the signal INT_CNT may be asserted. If the last BCOM rank is different (D) than the current BCOM rank, the signal INT_CNT may be deasserted.

Based on the currently determined condition A-P, the FSM circuit 120 may generate the signal INT_CNT in either a deasserted state 142 or an asserted state 144. While in the deasserted state 142, any condition A-P that results in the signal INT_CNT remaining deasserted (e.g., 0) may cause a transition (e.g., T1) that leaves the state transition diagram 140 in the deasserted state 142. The transition T1 may be calculated per formula (1) as follows:

$$T1 = A+B+C+D+E+F+G+H+I+J+K+L(D)+M(D)+N(D)+P(D) \quad (1)$$

Where "+" may denote a Boolean logical OR operation and "(D)" may denote that the last write rank is different from the current write rank.

Any condition L-P with the last write rank matching the current write rank (S) may cause another transition (e.g., T2) into the asserted state 144 and the signal INT_CNT to be asserted (e.g., 1). The transition T2 may be calculated per formula (2) as follows:

$$T2 = L(S)+M(S)+N(S)+P(S) \quad (2)$$

Where "(S)" may denote that the last write rank is the same as the current write rank.

While in the asserted state 144, the transition T2 may leave the state transition diagram 140 in the asserted state 144. While in the asserted state 144, the transition T1 may cause the state transition diagram 140 to move into the deasserted state 142. Other arrangements of the state transition diagram 140 may be implemented to meet the design criteria of a particular application.

In various embodiments, the FSM circuit 120, the counter circuit 126 and the state transition diagram 140 may be adapted to include power down command sequences and other command sequences in the data buffers 100a-100n and/or the RCD circuit 102. The power-related command sequences may include, but are not limited to power down exit command sequences, power down entry command sequences, power down related-to-other command sequences and various command-to-power down related command sequences. In some cases, the FSM circuit 120 may generate additional signals to the CDC circuit 124 that are passed along to the receiver circuits 104, the RCD circuit 102, other circuitry and/or custom circuitry within the data buffers 100a-100n.

Figure 7A:
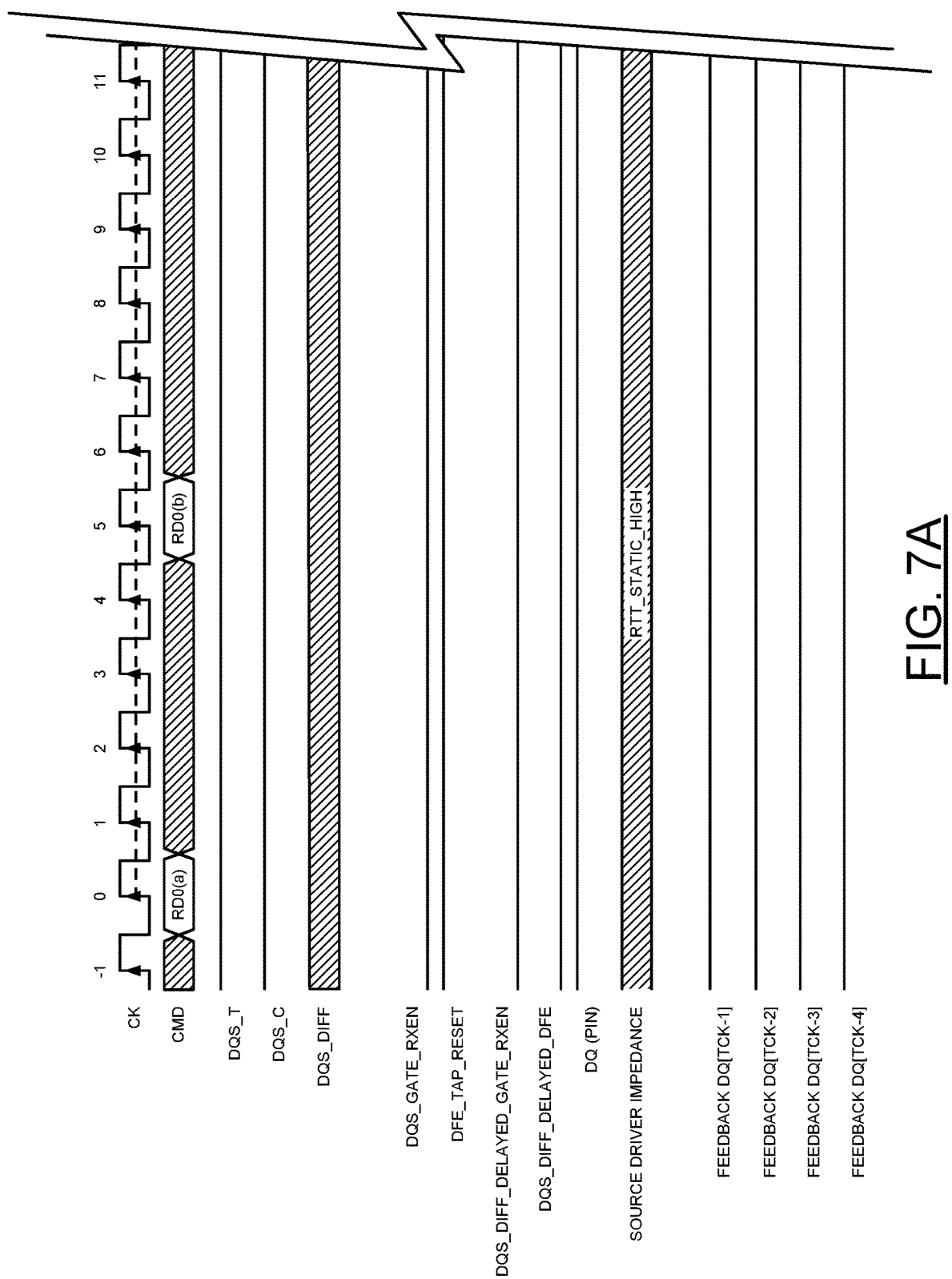
FIGS. 7A-7B are a diagram illustrating an operation involving a single device.
Figure 7B:
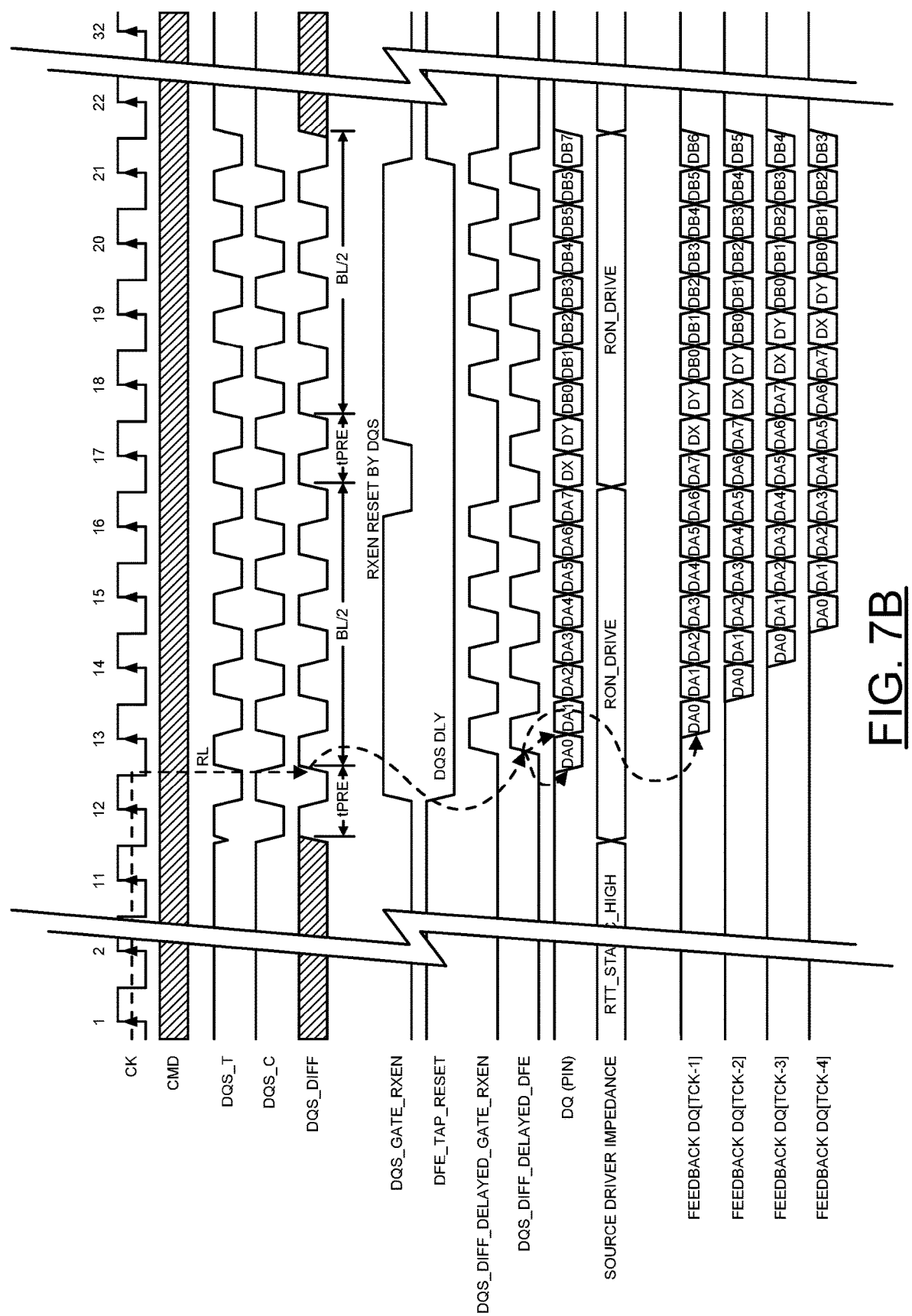

Referring to FIGS. 7A-7B, diagrams are shown illustrating two commands (e.g., RD0(a), RD0(b)) targeting the same device separated by five clock cycles (e.g., the case where $t_{CCD}$=5). In the illustrated case, DQS is continuous, but data bits (e.g., DX and DY) are normally gated in the data path. In embodiments where the receiver circuits 104 implement DFE circuitry, the signal CTRL generally controls a signal (e.g., DFE_TAP_RESET) generated inside the receiver circuits 104. During normal operations, the signal DFE_TAP_RESET may be the signal CTRL inverted. A high to low transition of the signal DFE_TAP_RESET (e.g., asserted low) caused by the FSM circuit 120 generally indicates a start of the data clocking by the signal DQS. The control logic of the data buffer generally ensures that the DFE feedback clock captures the Dx and Dy bits. Thus, no reset should occur between the commands and the RON drive level (e.g., RON_DRIVE) on the signal DQ during preamble transmission should not be Rtt (see FIG. 7B). The signal DFE_TAP_RESET may be asserted low to high (e.g., deasserted high) by the FSM circuit 120 after the last data bit (e.g., DB7) in the stream has been clocked into the receiver circuits 104 by the signal DQS.

Figure 8A:
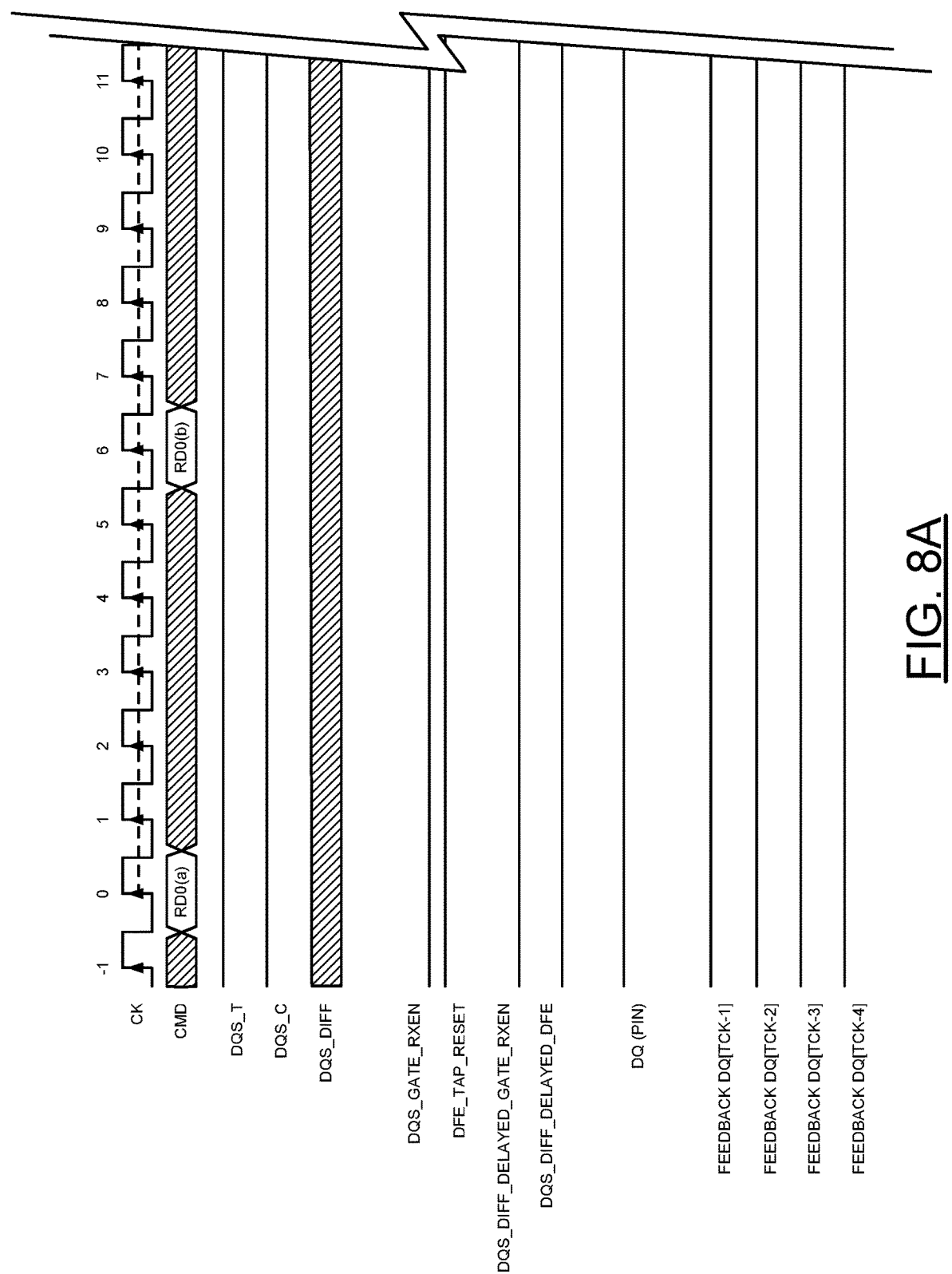
FIGS. 8A-8B are a diagram illustrating another operation involving the single device.
Figure 8B:
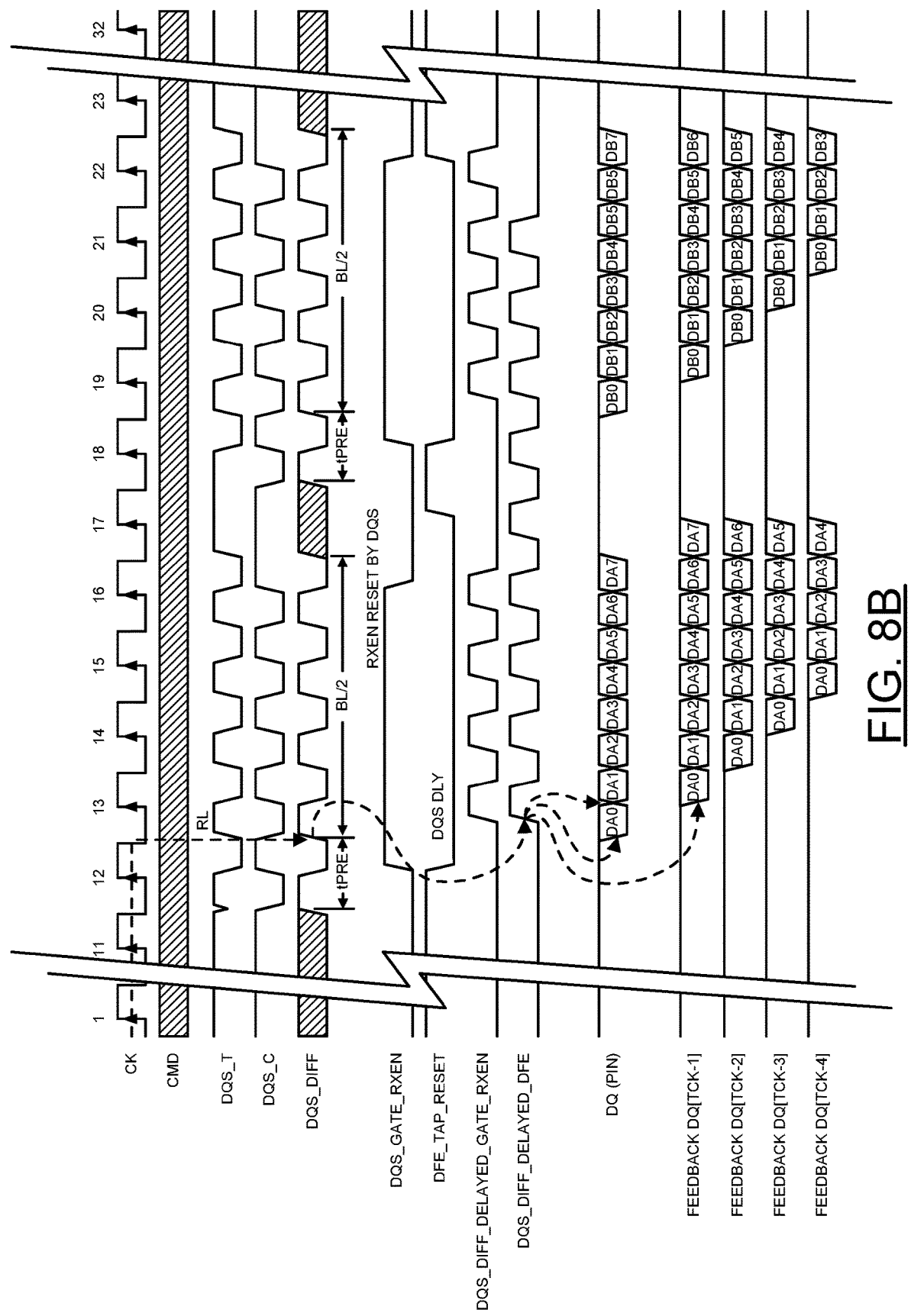

Referring to FIGS. 8A-8B, diagrams are shown illustrating an operation in the case where $t_{CCD}$=6 in the same device. Staying within the same bank group of memory devices 90a-90n at, e.g., 2,133 Mbps, generally utilizes 6 clock cycles between the column commands. However, only 4 clock cycles may be used to transfer the data (illustrated in FIGS. 8A and 8B). Two clock cycles (e.g., cycles 17 and 18 of the signal CK) become unusable and signal DQS may now be considered non-continuous. The FSM circuit 120 may cause the signal DFE_TAP_RESET to transition high to low at a beginning of an initial group of data bits (e.g., DA0-DA7). The signal DFE_TAP_RESET may transition from low to high at an end of the initial group of data bits (e.g., DA0-DA7). Another transition of the signal DFE-TAPRESET from high to low may indicate a start of the clock signal DQS for a next group of data bits (e.g., DB0-DB7). The signal DFE_TAP_RESET may return to the high state after the final data bit (e.g., DB7) has been received.

Figure 9A:
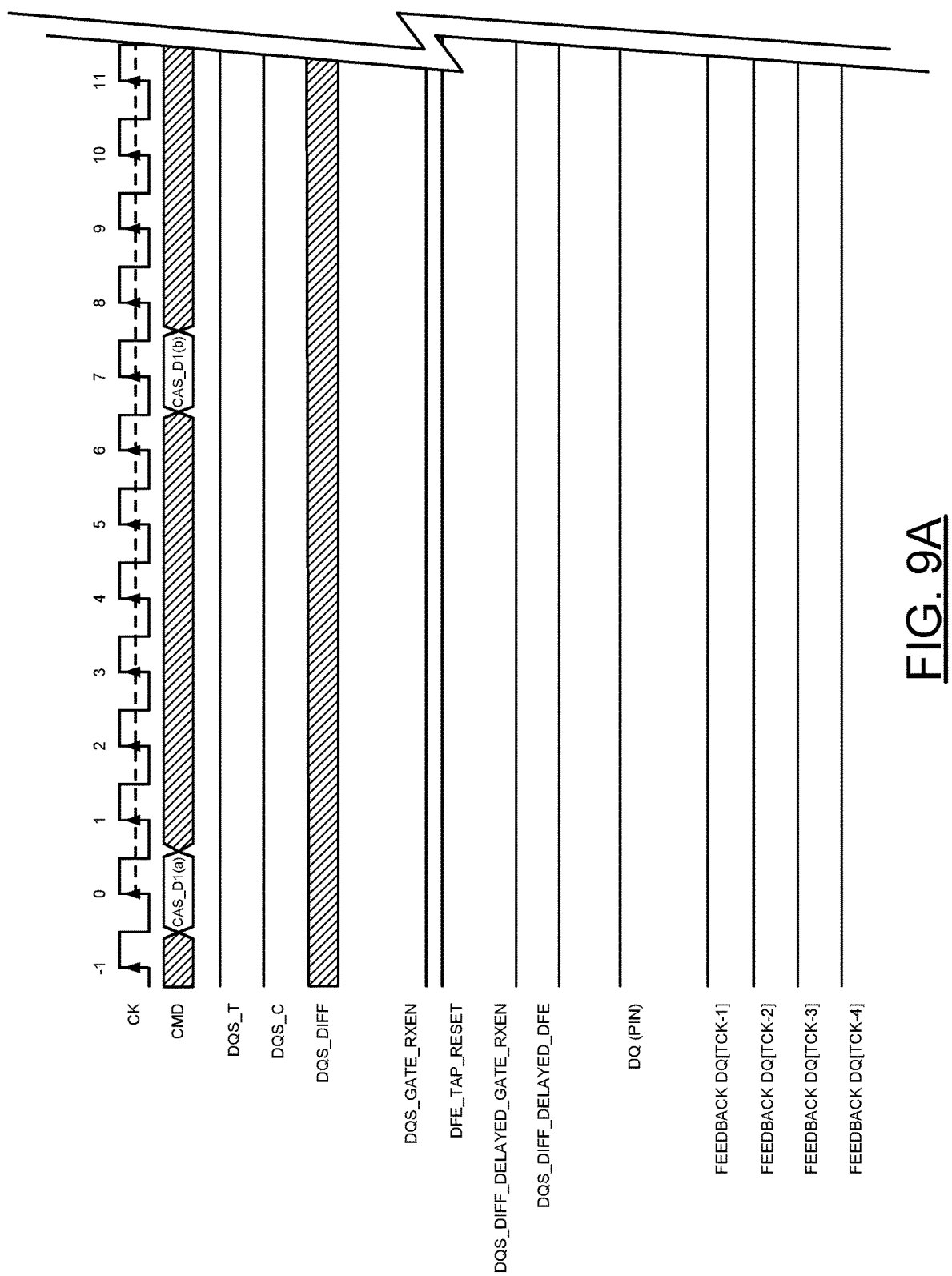
FIGS. 9A-9B are a diagram illustrating an operation involving two devices and/or command types.
Figure 9B:
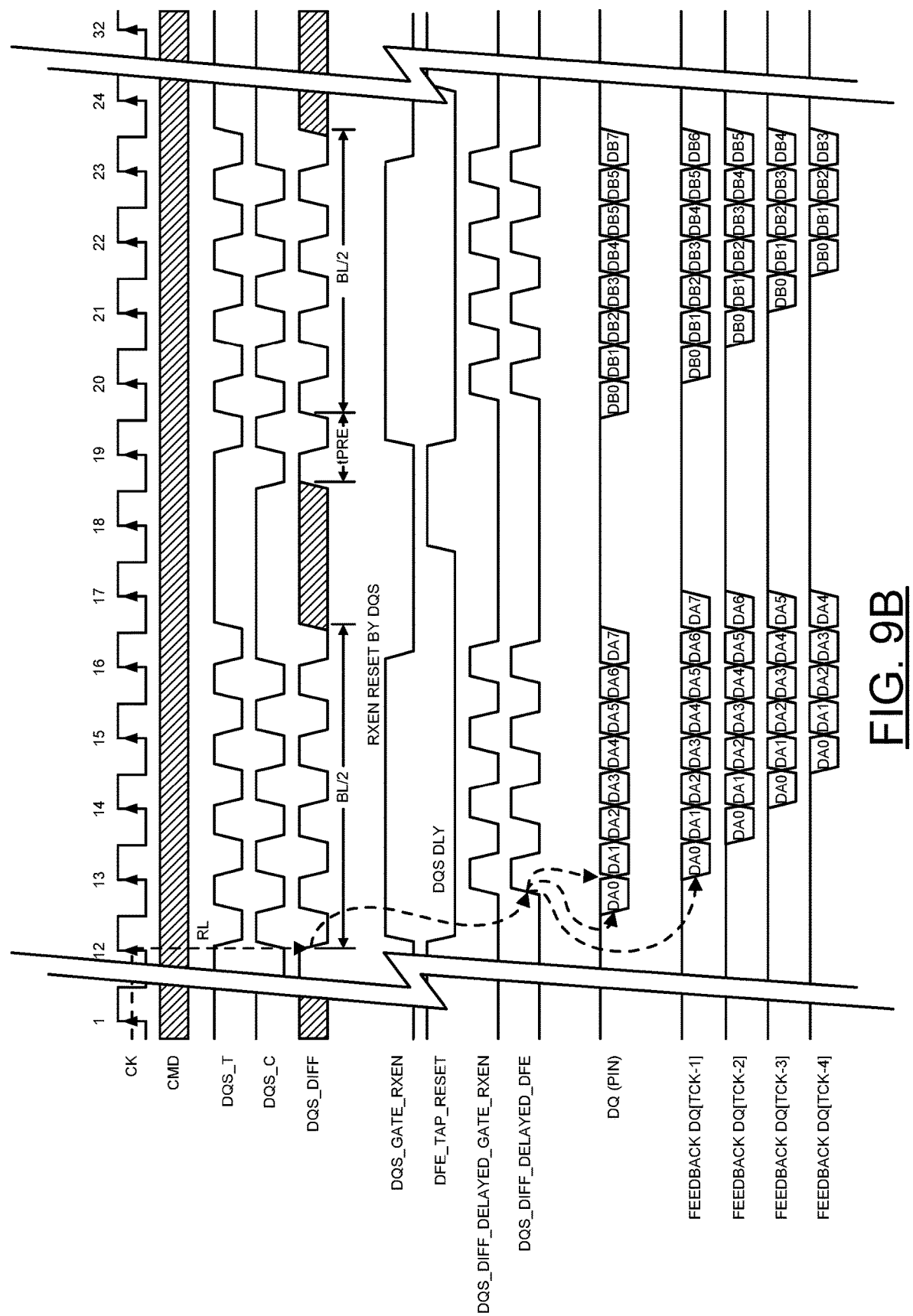

Referring to FIGS. 9A-9B, diagrams are shown illustrating a case where different devices/command types are involved. Referring to FIG. 9A, when different devices/command types (e.g., device-to-device, type-to-type, $t_{RRDD}$ or $t_{RWDD}$) are involved, a previous command with sufficient space leads to no inter-symbol interference on the next command. However, aggressive command spacings near or above current guidelines may influence some tap coefficients in a 1T preamble. The FSM circuit 120 may cause the signal DFE_TAP_RESET to transition from high to low to indicate a start of the clock signal DQS for the initial set of data bits (e.g., DA0-DA7). After the last data bit in the initial group has been clocked into the receiver circuit 104, the signal DFE_TAP_RESET may transition from low to high. When access to the different device/command type is ready (e.g., at the rising edge 19 of the signal CK), the signal DFE_TAP_RESET may transition from high to low to indicate the start of the next group of data bits (e.g., DB0-DB7). The FSM circuit 120 may cause the signal DFE_TAP_RESET to return to the high state after the final data bit (e.g., DB7) has been received in the signal DQ.

While FIG. 4 generally shows the command sequence detector circuit 102 and the receiver circuits 104 in the context of the data buffers 100a-100n while receiving information, copies of the command sequence detector circuit 102 and the receiver circuits 104 may be implemented at other locations, other data paths and/or other control paths. In some embodiments, copies of the command sequence detector circuit 102 and the receiver circuits 104 may be located in the memory devices 90a-90n when the data buffers 100a-100n are absent to improve the signals received from the memory controller 20 during write cycles. Instances of the command sequence detector circuit 102 and the receiver circuits 104 may also be implemented in other circuitry within the memory modules 50a-50n.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future (e.g., DDR5) memory specifications.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method for responding to a command sequence, comprising the steps of:
    receiving a signal from a host carrying a plurality of commands in said command sequence;
    detecting a non-consecutive clock associated with a start of a current command in said command sequence; and
    generating a control signal in an active state to indicate detection of said non-consecutive clock associated with said start of said current command in said command sequence.

2. The method according to claim 1, further comprising the step of:
    initializing a decision feedback equalizer in each of one or more receiver circuits of one or more data buffer circuits of a memory system in response to said control signal in said active state in preparation to receive an initial data bit from said host.

3. The method according to claim 2, wherein said data buffer circuits are at least double data rate fourth generation (DDR4) compliant.

4. The method according to claim 1, wherein said control signal is generated in said active state in response to detecting said non-consecutive clock associated with an initial command in said command sequence.

5. The method according to claim 4, further comprising the steps of:
    deasserting said control signal to a non-active state in response to a completion of a data transfer associated with said initial command from said host; and
    asserting said control signal in said active state in response to detecting said non-consecutive clock associated with a next command in said command sequence, wherein at least one clock period exists between said deassertion of said control signal in response to completion of said data transfer associated with said initial command and said assertion of said control signal in response to said non-consecutive clock associated with said next command in said command sequence.

6. The method according to claim 1, wherein said control signal is generated based on a rank of said current command in said command sequence relative to a last command in said command sequence.

7. The method according to claim 1, wherein said control signal is generated based on a length of a preamble in said current command in said command sequence.

8. The method according to claim 1, wherein said control signal of said current command in said command sequence is generated based on a burst length of a last command in said command sequence.

9. The method according to claim 1, further comprising the step of:
    converting said control signal from a first clock domain to a second clock domain.

10. The method according to claim 1, wherein the steps of receiving, detecting, and generating are performed in a dual in-line memory module (DIMM).

11. The method according to claim 10, wherein said DIMM is double data rate fourth generation (DDR4) compliant.

12. The method according to claim 1, wherein said current command is associated with a targeted access from said host to a memory system.

13. An apparatus comprising:
    an interface configured to receive a signal from a host carrying a plurality of commands in a command sequence; and
    a first state machine configured to (i) detect a non-consecutive clock associated with a start of a current command in said command sequence and (ii) generate a control signal in an active state to indicate detection of said non-consecutive clock associated with said start of said current command in said command sequence.

14. The apparatus according to claim 13, wherein said first state machine is further configured to initialize a decision feedback equalizer in each of one or more receiver circuits of one or more data buffer circuits of a memory system in response to said control signal in said active state in preparation to receive an initial data bit from said host.

15. The apparatus according to claim 14, wherein said data buffer circuits are at least double data rate fourth generation (DDR4) compliant.

16. The apparatus according to claim 13, wherein (i) said control signal is generated in said active state in response to detecting said non-consecutive clock associated with an initial command in said command sequence, and (ii) said control signal is deasserted to a non-active state in response to a completion of a data transfer associated with said initial command from said host.

17. The apparatus according to claim 16, wherein (i) said control signal is asserted in said active state in response to detecting said non-consecutive clock associated with a next command in said command sequence, and (ii) at least one clock period exists between said deassertion of said control signal in response to completion of said data transfer associated with said initial command and said assertion of said control signal in response to said non-consecutive clock associated with said next command in said command sequence.

18. The apparatus according to claim 16, wherein (i) said interface and said first state machine are configured as part of a dual in-line memory module (DIMM) and (ii) said DIMM is double data rate fourth generation (DDR4) compliant.

19. The apparatus according to claim 13, further comprising a second state machine configured to generate a data strobe receiver enable signal, wherein said control signal is responsive to said data strobe receiver enable signal.

20. The apparatus according to claim 13, wherein said current command is associated with a targeted access from said host to a memory system.

* * * * *